(12) United States Patent
Maindron et al.

(10) Patent No.: US 9,209,366 B2
(45) Date of Patent: Dec. 8, 2015

(54) ORGANIC OPTOELECTRONIC DEVICE AND METHOD FOR THE ENCAPSULATION THEREOF

(75) Inventors: Tony Maindron, Grenoble (FR); Hani Kanaan, Saint Martin d'Heres (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 0 days.

(21) Appl. No.: 14/131,569

(22) PCT Filed: Jul. 4, 2012

(86) PCT No.: PCT/IB2012/053410
§ 371 (c)(1),
(2), (4) Date: Jan. 8, 2014

(87) PCT Pub. No.: WO2013/008143
PCT Pub. Date: Jan. 17, 2013

(65) Prior Publication Data
US 2014/0138719 A1 May 22, 2014

(30) Foreign Application Priority Data
Jul. 8, 2011 (FR) .................................. 11 56224

(51) Int. Cl.
H01L 33/52 (2010.01)
H01L 51/52 (2006.01)
H01L 51/56 (2006.01)
H01L 51/00 (2006.01)

(52) U.S. Cl.
CPC ............ *H01L 33/52* (2013.01); *H01L 51/0017* (2013.01); *H01L 51/5221* (2013.01); *H01L 51/5253* (2013.01); *H01L 51/56* (2013.01);
(Continued)

(58) Field of Classification Search
None
See application file for complete search history.

(56) References Cited

U.S. PATENT DOCUMENTS 5,686,360 A * 11/1997 Harvey et al. .................. 438/28
6,891,325 B1 * 5/2005 Nice et al. ..................... 313/504
7,342,356 B2 * 3/2008 McCormick et al. ......... 313/512
(Continued)

FOREIGN PATENT DOCUMENTS

JP 2000-40594 A 2/2000
WO WO-01/39287 A1 5/2001
WO WO-2009/101299 A1 8/2009

OTHER PUBLICATIONS

International Search Report and Written Opinion for Application No. PCT/IB2012/053410; dated Oct. 15, 2012.

*Primary Examiner* — Jenny L Wagner
*Assistant Examiner* — Steven B Gauthier
(74) *Attorney, Agent, or Firm* — Alston & Bird LLP

(57) ABSTRACT

The invention relates to an organic optoelectronic device which is protected from ambient air by a sealed encapsulation structure of the type including at least one thin layer. The device includes a substrate; at least one light-emitting unit deposited on the substrate, incorporating internal electrodes and external electrodes defining an active zone and, between the electrodes, a stack of organic films; and a sealed encapsulation structure having one or more thin layers including at least one inorganic layer placed on top of the light-emitting unit and encasing same laterally. The device also includes a pre-encapsulation structure located between the external electrode and the encapsulation structure and which includes a buffer layer covering the external electrode and contains a heterocyclic organometallic complex having a glass transition temperature above 80° C., and a barrier layer covering the buffer layer and contains a silicon oxide SiOx, wherein x is 0<x<2.

10 Claims, 8 Drawing Sheets

(52) U.S. Cl.
CPC ..... *H01L 51/0003* (2013.01); *H01L 2251/5315* (2013.01); *H01L 2924/0002* (2013.01)

(56) References Cited

U.S. PATENT DOCUMENTS

| | | | |
|---|---|---|---|
| 7,951,726 B2 * | 5/2011 | Kim et al. | 438/761 |
| 2005/0280355 A1 * | 12/2005 | Lee et al. | 313/503 |
| 2006/0061272 A1 | 3/2006 | McCormick et al. | |
| 2006/0246620 A1 | 11/2006 | Nagayama et al. | |
| 2008/0305360 A1 * | 12/2008 | Han et al. | 428/690 |
| 2009/0161216 A1 * | 6/2009 | Nam Goong et al. | 359/513 |
| 2010/0087032 A1 | 4/2010 | Yoshizawa et al. | |
| 2010/0276818 A1 | 11/2010 | Maindron et al. | |

* cited by examiner

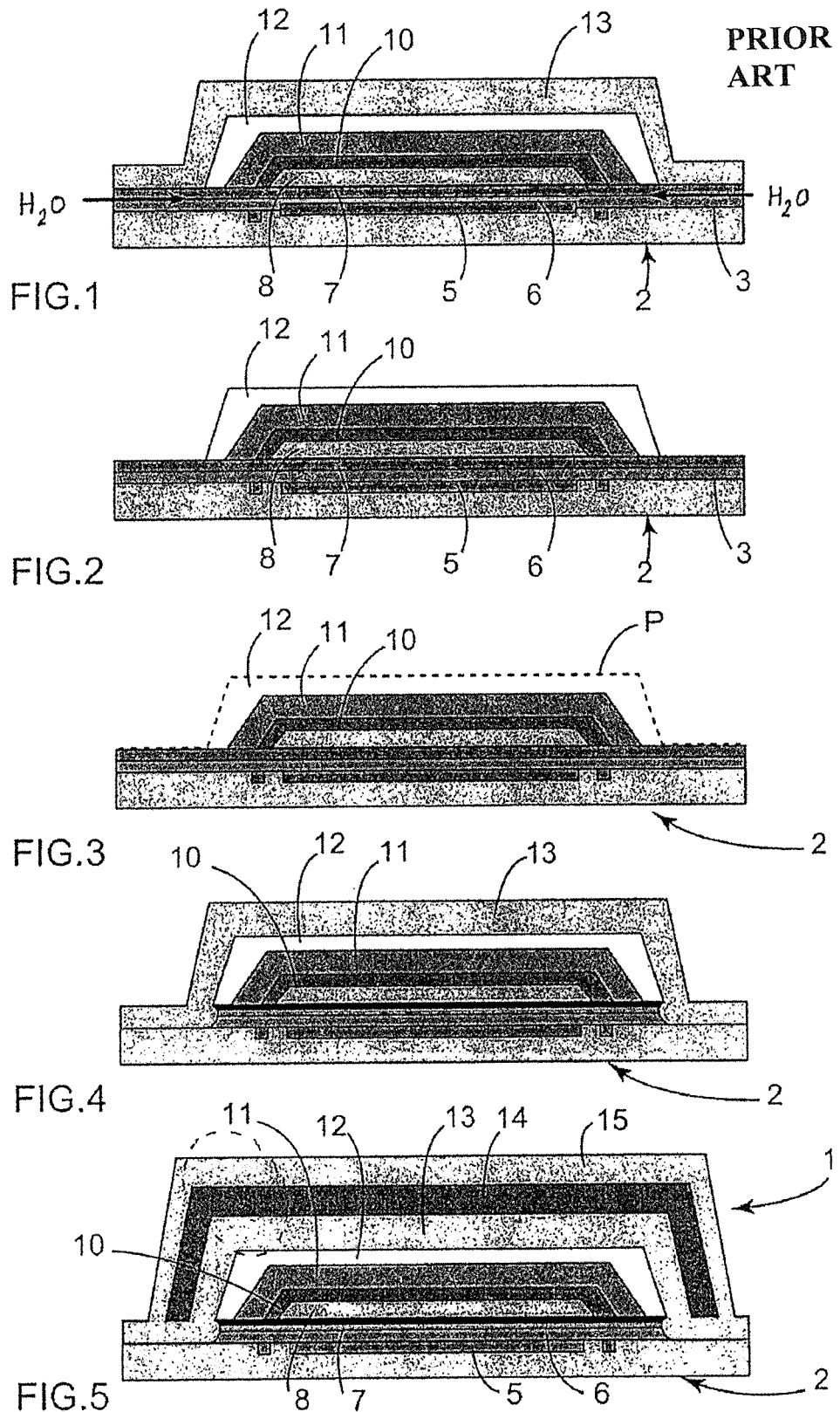

ORGANIC OPTOELECTRONIC DEVICE AND METHOD FOR THE ENCAPSULATION THEREOF

FIELD

The present invention relates to an organic optoelectronic device, such as a micro-display unit using organic light-emitting diodes (OLEDs), which is protected from the ambient air by a sealed encapsulation of the type including at least one thin layer, and to a method for the encapsulation of this device. The invention is applicable, notably but not exclusively, to hybrid electroluminescent units.

BACKGROUND

It is known that organic optoelectronic devices such as OLEDs must be encapsulated in order to protect their sensitive components against gas species in the atmosphere (mainly oxygen and water vapor). This is because, if this protection is not provided in a suitable way, there is a risk of further degradation of the device, manifested mainly in the appearance of non-emissive black spots in the case of OLEDs, which are in fact the result of the penetration of water vapor into the diode, which degrades the interface between the cathode (or anode) and the organic film or films.

This encapsulation may typically be provided by using a glass lid bonded onto the organic device by means of a special adhesive which has, notably, low water permeability. As a general rule, a solid moisture absorber or "getter" is added between the substrate and the lid to extend the lifetime of the device.

For some applications, and also in order to reduce costs, thin layers with a barrier action have been developed, for the purpose of protecting the underlying device against damage by moisture, in a similar way to the lid and getter assembly. As a general rule, these barrier layers are oxides, nitrides or oxynitrides, or, in some cases, thin metallic layers, unless the electroluminescent unit is what is known as "top emission" unit, emitting from the top of the structure, in which case the barrier layers must be transparent.

These thin encapsulation layers typically have a total thickness of less than 1 µm, and are deposited by standard vacuum deposition methods such as chemical vapor phase deposition (CVD), which may be plasma assisted (PECVD), atomic layer deposition (ALD, sometimes called AL-CVD), or physical vapor phase deposition (PVD) including evaporation and spraying. It is difficult to envisage the deposition of these thin encapsulation layers by means of other, less time-intensive types of deposition, such as liquid phase deposition, because this type of deposition requires the use of polymer solutions containing solvents which may dissolve the layers of the underlying electroluminescent unit.

In the specific case of hybrid OLED units, in other words those in which the stack of organic films interleaved between the electrodes includes among its innermost active films one or more films deposited by a liquid route (typically by what is known as "spin coating"), so that the control of deposition is simpler than in the case of printing techniques, the problem of the precise location of these films arises, this problem being of major importance for the production of large numbers of micro-screens on a silicon slice. This is because these films, such as electron transport layer (ETL), hole injection layer (HIL) and hole transport layer (HTL) films, are deposited by a liquid route over the whole substrate (that is to say, over the whole surface of the silicon slice) and therefore cannot be precisely located (that is to say, confined to the OLED unit) unless photolithography is performed subsequently, which is unfortunately less feasible because of the fragility of the components of OLED units when subjected to etching. Now, it is known that these films deposited by a liquid route, if they are not subsequently confined to the active zone of the corresponding micro-screen, will adversely affect the quality of encapsulation of the OLED unit because they form a lateral channel for the ingress of ambient atmospheric water vapor into the OLED unit by permeation, and because the encapsulation deposited onto these films does not adhere satisfactorily to them.

The document WO-A1-2009/101299 in the name of the present applicant discloses the use, in a thin-layer encapsulation of an organic optoelectronic device, of a continuous moisture-reactive layer based on an organometallic complex such as tris(8-hydroxyquinolinato)aluminum (III) (Alq3), and a barrier layer surmounting it and that may consist of an oxide chosen from among those conforming to the formulae $Al_2O_3$, $SiO_2$, $Si_xN_y$ and $SiO_xN_y$.

The document US-A-2006/0061272 shows, in its FIG. 3, an optoelectronic device comprising a barrier layer, based on silicon monoxide for example, covering a buffer layer, based on Alq3 for example. The buffer layer is placed on top of an external electrode and a stack of light-emitting organic films, and the barrier layer is surmounted by an encapsulation with two inorganic layers and is spaced apart laterally from the stack of films in this figure, by the buffer layer on the right and by the external electrode and this buffer layer on the left.

SUMMARY

One object of the present invention is to propose an organic optoelectronic device, such as a micro-display having organic light-emitting diodes, which overcomes the aforementioned drawbacks, this device comprising:
  a substrate,
  at least one electroluminescent unit deposited on this substrate and incorporating an internal electrode adjacent to the substrate, an external electrode which is transparent or semi-transparent to the light emitted by the unit and which defines an active light emission zone, and a stack of organic films between these electrodes, and
  a sealed encapsulation structure including one or more thin layers, comprising at least one inorganic layer placed on top of said electroluminescent unit and encasing the unit laterally,
  this device further comprising a pre-encapsulation structure which is located between the external electrode and the encapsulation structure and which comprises a buffer layer covering the external electrode and based on at least one heterocyclic organometallic complex with a glass transition temperature above 80° C., and a barrier layer covering this buffer layer and based on a silicon oxide $SiO_x$, where x is a real number such that $0 < x < 2$.

For this purpose, a device according to the invention is such that the electroluminescent unit, or each electroluminescent unit, is of the hybrid type, at least one of the active films of said stack that it includes, preferably the innermost film or films forming for example at least an electron transport film (ETL), a hole injection film (HIL) and/or a hole transport film (HTL), being deposited by a liquid route over the whole substrate and then structured by dry etching such that this structured film or films terminate laterally substantially at right angles to a peripheral edge of the barrier layer.

This pre-encapsulation structure according to the invention advantageously forms a hard mask adapted to resist this dry etching, which is carried out, for example, by means of an oxygen plasma or by reactive ion etching (RIE), thus protecting the sensitive components of the electroluminescent unit, or of each electroluminescent unit, during the structuring of this active film or films deposited by a liquid route. This pre-encapsulation therefore allows the dry etching of the surface of the substrate covered with these films deposited by a liquid route, without degradation of the components of the electroluminescent unit, for the purpose of structuring these films so as to confine them at right angles to the active zone, or to each active zone, of the device (that is to say, by using this etching to remove their portions extending beyond the electroluminescent unit or each electroluminescent unit).

It should be noted that the pre-encapsulation structure produced by the deposition of these buffer and barrier layers makes it possible, notably, to passivate the electroluminescent unit or each electroluminescent unit in a satisfactory way, and to lengthen the lifetime of the device.

It should also be noted that this pre-encapsulation structure enables the surface intended to receive said inorganic encapsulation layer to be planarized, by homogenizing the —OH group surface density of the barrier layer to ensure a homogeneous growth of this inorganic layer on the latter.

Preferably, said silicon oxide with the formula $SiO_x$ of the barrier layer is such that x is substantially equal to 1, this barrier layer being deposited by non-reactive thermal evaporation.

It should be noted that this selection of a silicon oxide close to silicon monoxide (with the formula SiO) for the barrier layer gives rise to a synergic effect in combination with this organometallic complex chosen for the buffer layer, making it possible, notably, to optimize the aforesaid passivation for the electroluminescent unit or each electroluminescent unit, and to achieve a satisfactory compromise for this barrier layer between maximum transparency in the visible domain and minimum porosity.

According to another characteristic of the invention, said device may further include electrically conductive connecting means which directly link an inner peripheral edge of the external electrode to an electrical contact of the latter provided in said substrate, and which pass through the innermost active film or films of said stack which have been deposited by a liquid route.

These connecting means may advantageously form an annular metallic channel, preferably aluminum based, in the form of a distribution of metal atoms which are spread through said active film or films as far as said electrical contact in the shape of a ring, and optionally additionally through the outer electrode which in this case has a thickness of less than 20 nm.

It should be noted that these connecting means serve to minimize the contact resistance of said film or films deposited by a liquid route, these films being weak electrical conductors and masking said electrical contact, and consequently to increase the current strength in the diode.

As a general rule, said buffer layer may advantageously have a thickness in the range from 10 nm to 200 nm, for example from 50 nm to 150 nm.

Preferably, said organometallic complex of the buffer layer is a quinoline or benzoquinoline derivative and may advantageously have a glass transition temperature above 80° C., possibly up to 100° C. Even more preferably, this organometallic complex is tris(8-hydroxyquinolinato)aluminum (III) (Alq3).

According to a further preferred characteristic of the invention, said buffer layer has a surface area at least equal to that of said external electrode, which preferably consists of a silver cathode, and said barrier layer has a surface area at least equal to that of the buffer layer.

Advantageously, the barrier layer may extend laterally around and beyond the buffer layer which extends laterally around and beyond the external electrode, and both of said buffer and barrier layers can extend continuously from internal films of said stack of films.

According to a further characteristic of the invention, said encapsulation structure may comprise a said inorganic layer, or inner inorganic layer, which is deposited on said pre-encapsulation barrier layer by atomic layer deposition (ALD) or by plasma-assisted chemical vapor phase deposition (PECVD), which is based on at least one inorganic compound chosen from the group formed by compounds with the formulae $Al_xO_y$, $SiO_x$, $Si_xN_y$, $SiO_xN_y$, ZnSe, $Sb_2O_3$ and transparent conductive oxides (TCOs) optionally combined with a metal, and which is preferably based on $Al_2O_3$ deposited by ALD, this inner inorganic layer extending from the substrate and laterally coating said barrier layer and a plurality of said organic films of said stack.

According to a preferred embodiment of the invention, said encapsulation structure further comprises:
at least one etched photosensitive polymer layer which is preferably based on a positive photolithographic resin and which covers said inner inorganic layer in a laterally encasing manner by extending from the substrate, and
another said inorganic layer, or outer inorganic layer, which is for example based on the same compound as said inner inorganic layer, and which covers this photosensitive polymer layer in a laterally encasing manner, so as to form a plurality of surfaces, parallel to each other and substantially perpendicular to the plane of the substrate, which surfaces form the same number of obstacles to the lateral penetration of water vapor toward said active area, or each active area, of the device.

The term "positive resin" denotes, in a known way, a resin which is polymerized at the time of its deposition, the parts selectively exposed to radiation through a mask being depolymerized and then dissolved during development. In a variant, this resin may be negative (that is to say, its irradiated area is polymerized and thus becomes insoluble during development).

An encapsulation method according to the invention for a device as defined above comprises the following successive steps:

a) said buffer layer is deposited on said external electrode of the electroluminescent unit or of each electroluminescent unit, the buffer layer being preferably based on an organometallic complex derived from quinoline or benzoquinoline with a glass transition temperature above 100° C., such as tris(8-hydroxyquinolinato)aluminum (III) (Alq3), b) said barrier layer is deposited by non-reactive thermal evaporation on this buffer layer, this barrier layer being based on an oxide with the formula $SiO_x$, where x is preferably substantially equal to 1, and laterally coating the buffer layer, c) optionally, the electroluminescent unit, or each electroluminescent unit, covered with these buffer and barrier layers for its encapsulation, is transferred directly to the ambient atmosphere without being confined in a transfer enclosure such as a glove box, d) the electroluminescent unit, or each electroluminescent unit, covered with these buffer and barrier layers, is subjected to dry etching, carried out for example by means of an oxygen plasma or by reactive ion etching (RIE), and then e) a said inorganic layer of said encapsulation structure, or inner inorganic layer, is deposited on the barrier layer by atomic layer deposition (ALD) or by plasma-assisted chemical vapor phase deposition (PECVD), this inner inorganic layer being based on at least one inorganic compound chosen from the group formed by compounds with the formulae $Al_xO_y$, $SiO_x$, $Si_xN_y$, $SiO_xN_y$, ZnSe, $Sb_2O_3$ and transparent conductive oxides (TCOs) optionally combined with a metal, and preferably being based on $Al_2O_3$ deposited by ALD, in such a way that this inner inorganic layer extends from the substrate, thereby laterally coating the barrier layer and said innermost film or films of said stack.

The dry etching step d) may enable at least one of the innermost active films of said stack of this unit to be structured, in the case where it has been deposited by a liquid route over the whole substrate, so that it terminates laterally at right angles to or within a peripheral edge of said barrier layer, by removal of the portion of said at least one film which extends laterally beyond the barrier layer, said at least one structured film forming, for example, an electron transport film (ETL), a hole injection film (HIL) and/or a hole transport film (HTL), these buffer and barrier layers then acting as a hard mask during the etching.

Even if it does not serve to structure the active film or films, it has been found that this dry etching step promotes the subsequent deposition step e), notably in the case of deposition by ALD.

As mentioned regarding step c) above, it should be noted that this method according to the invention allows exposure to the ambient air (that is to say, direct transfer into the breathable atmosphere of the clean room without the use of a normal transfer box, also known as an "air break") of the electroluminescent unit or of each electroluminescent unit covered with the pre-encapsulation structure for the purpose of its encapsulation, owing to the presence of this pre-encapsulation structure.

Advantageously, said method according to the invention may further comprise, before the aforesaid step a), deposition by localized spraying of metal atoms, preferably aluminum based, through said innermost active film or films which have been deposited previously by a liquid route, so that these atoms are distributed through said active film or films, thus forming therein an electrically conductive annular channel which directly connects an inner peripheral edge of the external electrode to an electrical contact of the latter provided in said substrate.

This deposition can be carried out by localized spraying by means of a perforated mask (known as a "shadow mask"), in order to give said channel an annular shape like that of said electrical contact of the external electrode, this spraying being carried out, according to choice, either before the deposition of the external electrode directly onto and through said innermost active film or films deposited by a liquid route, or after the deposition of the external electrode, which in this case preferably has a thickness of less than 20 nm, directly onto and through said external electrode and the innermost active film or films.

It should be noted that the deposition of this conductive annular channel is carried out according to the invention by a PVD method which is specifically of the spraying type, the present applicant having discovered that PVD by thermal evaporation does not provide sufficient penetration of the inner active film or films by the metal atoms.

According to the preferred embodiment of the invention, this method may further comprise a step f), following step e), in which:

f1) a photosensitive layer, based for example on a positive photolithographic resin, is deposited in liquid phase onto said inner inorganic layer (by any coating method, such as spin coating or coating by immersion, also known as "dip coating"), f2) this photosensitive layer, deposited in this way, is etched by irradiation at predetermined points by selectively masking the incident radiation so that the layer is, on the one hand, polymerized as a result of this irradiation above said inner inorganic layer and in an enveloping portion which originates from the substrate and laterally coats this inner inorganic layer, and, on the other hand, depolymerized elsewhere, after which f3) this polymerized photosensitive layer is developed by immersion in a bath, optionally followed by supplementary irradiation of this photosensitive layer.

It should be noted that the aforementioned step e) is preferably carried out by ALD, a form of deposition which can be carried out at low temperature and which makes it possible to obtain an inorganic layer with a high density and very low permeability which follows as closely as possible the micro- or nano-relief of the underlying surface, and that this inner inorganic layer deposited by ALD allows the use in step f) of polar or apolar solvents, for example ethanol, water, acetone and photosensitive resin development/stripping solutions such as those known as TMAH and ROR.

Advantageously, with reference to this preferred embodiment of the invention, this method may further comprise a step g), following step f), in which another said inorganic layer, or outer inorganic layer, which is for example based on the same compound as said inner inorganic layer, is deposited onto said photosensitive polymer layer and also covers this photosensitive polymer layer in a laterally encasing manner, so as to form a plurality of surfaces, parallel to each other and substantially perpendicular to the plane of the substrate, which surfaces form the same number of obstacles to the lateral penetration of water vapor toward said active area, or each active area, of the device.

BRIEF DESCRIPTION OF THE DRAWINGS

Other advantages, characteristics and details of the invention will be made clear by the remainder of the following description which refers to the appended drawings, provided solely by way of example, in which:

FIG. 1 is a schematic cross-sectional view of a hybrid electroluminescent unit device not made according to the invention, in which the organic films deposited by a liquid route have not been confined to this unit between the pre-encapsulation deposition and the encapsulation deposition, FIG. 2 is a schematic cross-sectional view showing the result of a first step of pre-encapsulation of a hybrid electroluminescent unit device according to the invention, before the confinement of these organic films deposited by a liquid route, FIG. 3 is a schematic cross-sectional view illustrating the action of dry etching on the device of FIG. 2 for the purpose of creating this confinement, before the encapsulation of the pre-encapsulated device, FIG. 4 is a schematic cross-sectional view showing, on the one hand, the result of this dry etching with the confinement of these films and, on the other hand, the result of a further step of deposition of an inner inorganic encapsulation layer onto this pre-encapsulation, FIG. 5 is a schematic cross-sectional view of a device according to the invention which is the end product of the steps of FIGS. 2 to 4, showing two organic and inorganic encapsulation layers subsequently deposited on the inner inorganic layer.

DETAILED DESCRIPTION

Figure 6:
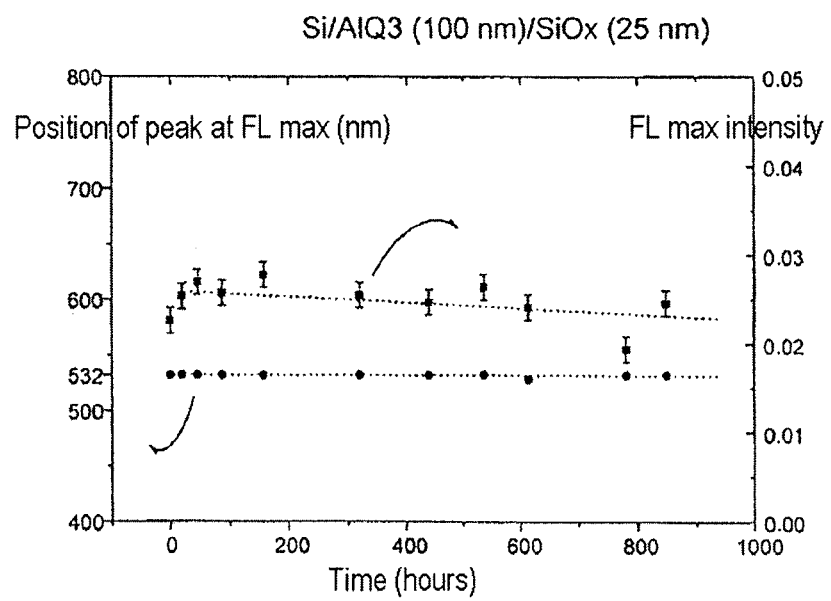
FIGS. 6 and 7 are two graphs showing the behavior in a climate-controlled chamber of a layer of Alq3 with a thickness of 100 nm deposited on silicon and encapsulated by a layer of SiO with a thickness of 25 nm (FIG. 6) and with a thickness of 10 nm (FIG. 7), showing for each of these the variation during the storage time of the intensity of photoluminescence (FL) of the film and the variation of the position of the peak at maximum intensity.

The pre-encapsulation structure according to the invention illustrated in FIGS. 2 and 3, and the encapsulation structure illustrated in FIGS. 4 and 5, cover the external emitting face of an electroluminescent optoelectronic device 1 of the OLED type (shown in the fully encapsulated state in FIG. 5), the sensitive components of which must be protected from the moisture and oxygen of the ambient air. This device 1 is, for example, of the OLED micro-screen type, comprising a substrate 2, typically made of silicon, covered on its flat surface 3 with an electroluminescent unit defining a central active zone (visible in FIG. 16) and an electrical connection zone (not visible). The unit has an internal electrode 5 (such as an anode) and an external electrode 10 (such as a cathode) between which is interleaved a light-emitting structure having a plurality of organic films 6, 7, 8 designed to transfer the electrons and the holes which originate from the electrodes 5 and 10 and which are recombined to generate excitons and consequently the emission of light, at least the external electrode 10 being transparent or semi-transparent to the emitted light in order to cause the light to be radiated via the active zone toward the outside of the device 1.

This external electrode 10 may be made of a metal such as silver, aluminum or samarium—preferably silver—because of the transparency properties of these metals in the visible domain and their electrical conductivity when very thin (for example, the thickness of the external electrode 10 is in the range from 10 nm to 30 nm).

The electroluminescent unit illustrated in FIGS. 1 to 5 is of the hybrid type, since it comprises among the innermost films of its emitting structure the active films 6 and 7 deposited by a liquid route over the whole surface 3 of the substrate 2, by spin coating for example. These films deposited by a liquid route may include, for example, an electron transfer film (ETL), for example one of the poly(3,4-ethylenedioxythiophene) (PEDOT) type, and a hole transfer film (HTL), for example one that is p-doped from a solution, with the proviso that a larger number of films may be used.

In the device not made according to the invention, shown in FIG. 1, where these films deposited by a liquid route remain on the whole surface 3 of the substrate 2 after the deposition onto the cathode 10 of an Alq3/$SiO_X$ pre-encapsulation (indicated by layers 11 and 12), which itself is covered with an inorganic encapsulation layer 13 of $Al_2O_3$, experience has shown that the water vapor from the ambient atmosphere penetrates laterally into the OLED unit by permeation through these films 6 and 7 deposited by a liquid route, which extend beyond the active zone 4 of this unit.

In order to remedy this drawback, provision is made according to the invention to subject the OLED unit, previously covered with the passivating pre-encapsulation structure 11, 12 illustrated in FIG. 2 (that is to say the structure formed by a buffer layer 11 of Alq3 coated with a barrier layer 12 of $SiO_x$), to dry etching, which is, for example, carried out by means of an oxygen plasma or by reactive ion etching (RIE), in order to structure these internal films 6 and by removing their portions extending beyond the barrier layer 12. As illustrated by the broken lines P in FIG. 3, the whole of the surface of the pre-encapsulated unit is exposed to this dry etching, and, as can be seen in FIG. 4, the result of this etching is that these films 6 and 7 are structured so as to be entirely confined within the peripheral edge of the barrier layer 12, before the encapsulation is deposited.

Advantageously, the buffer layer 11 of Alq3 has a thickness in the range from 100 nm to 200 nm, this thickness being, for example, close to 100 nm (for green emission). As regards the barrier layer 12 of $SiO_x$ which is deposited by non-reactive thermal evaporation, this has a thickness which is, for example, in the range from 5 nm to 50 nm.

Figure 16:
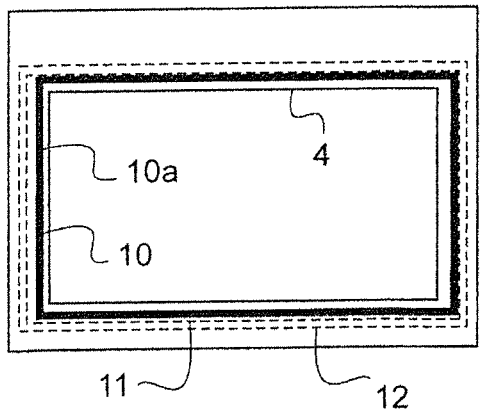
FIG. 16 is a schematic plan view illustrating the sequence of masks and the encasing nature of the layers deposited for the pre-encapsulation of an OLED on its cathode according to the invention.

As can be seen in FIG. 16, particular care has been taken in the design of the deposition of the barrier layer 12 of $SiO_x$, since a shadow mask with a greater surface area has been used for the deposition of this oxide layer 12. In this way it is possible to ensure that the contact covered by the buffer layer 11 of Alq3 is entirely coated with this layer 12 of evaporated silica. This FIG. 16 also shows the deposition zone of the cathode 10 and the cathode ring 10a, as well as the deposition zones of the layers 11 and 12.

Figure 17:
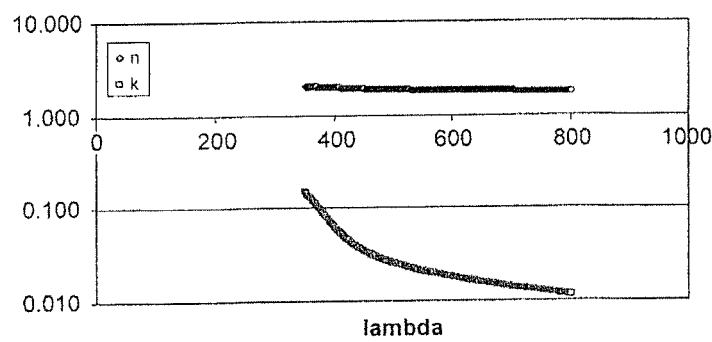
FIG. 17 is a graph illustrating ellipsometry measurements made on the barrier layer of $SiO_X$ according to the invention deposited by thermal evaporation, in the form of two curves of optical constants n and k as a function of the emitted wavelength.

FIG. 17 illustrates the optical characteristics of the deposited layer 12 of $SiO_x$, measured by ellipsometry. This SiO deposited by non-reactive thermal evaporation has a mean optical index of 1.884 nm over the visible range, and an optical index of 1.892 at 500 nm. By comparison with the published data which indicate that the optical index of SiO (x=1) is equal to 2±0.03 at 500 nm, and that the optical index of evaporated $SiO_x$ where x is close to 2 is in the range from 1.45 to 1.47, this measured index for the $SiO_x$ of the invention clearly demonstrates a stoichiometry close to 1:1, or in other words that x is substantially equal to 1.

The encapsulation structure 13, 14, 15 comprises an inner inorganic layer 13 of $Al_2O_3$ deposited by ALD and encasing the barrier layer 12 of SiO (visible in FIG. 4), and a photosensitive polymer layer 14 deposited in the liquid phase, which in turn encases the inorganic layer 13 and which is surmounted and encased by an outer inorganic layer 15, for example one which is also made of $Al_2O_3$ deposited by ALD (these two layers 14 and 15 are visible in FIG. 5, in which these mutually encasing depositions are indicated by a dotted zone).

The polymer layer 14, for example a layer based on a positive photolithographic resin known as TELR, is deposited, for example by coating onto the inner inorganic layer 13, after which it is etched by irradiation with UV radiation, while being masked selectively from the UV radiation, so that it is polymerized above the inner inorganic layer 13 and in an encasing portion which laterally coats this layer 13, and is depolymerized elsewhere. This polymerized photosensitive layer is then developed by immersion in a bath (in a bath of TMAH developer, for example), and supplementary irradiation of the resulting photosensitive layer 14 may optionally be carried out.

Figure 7:
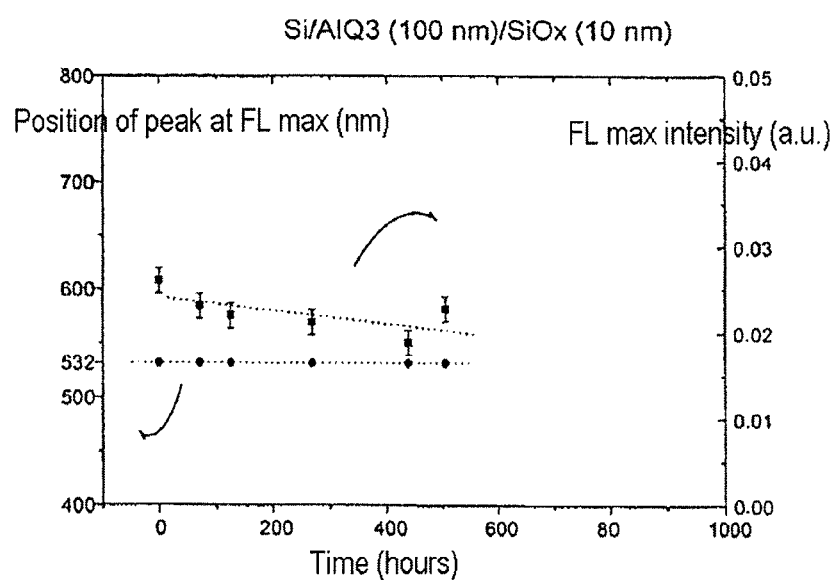

The present applicant has conducted tests, the results of which are visible in FIGS. 6 and 7, illustrating the quality of the encapsulation of a buffer layer of Alq3 with a thickness of 100 nm deposited on silicon and coated with a barrier layer of $SiO_x$ with a thickness of 25 nm and 10 nm, respectively. These tests have demonstrated that the layer of Alq3 with a thickness of 100 nm is encapsulated by the layer of $SiO_x$ in such a way as to be robust in a climate-controlled chamber. More precisely, the behavior of these layers of Alq3/$SiO_x$ is shown on these graphs (at 65° C. and at 85% relative humidity (RH)). The behavior of these two layers in an oven was quantified by monitoring the variation, starting from $t_0$, of the photoluminescence (FL) of the layer of Alq3 (excitation under UV light at 365 nm, under a microscope with a magnification of ×10 at maximum intensity of FL, and at the position of the peak at maximum intensity—green emission at 532 nm for Alq3 in the solid state—versus the period of storage in the climate-controlled chamber). Thus FIGS. 6 and 7 show the variation of FL at 65° C. and 85% RH (maximum intensity FL max and position of the peak at the intensity of FL max) of 100 nm thick films of Alq3 deposited on Si and encapsulated with $SiO_x$.

Figure 8:
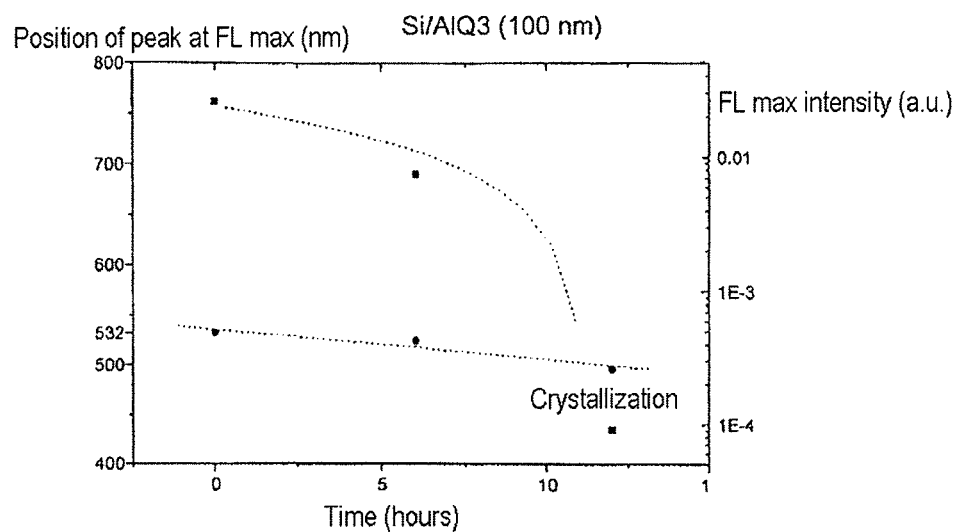
FIGS. 8 and 9 are two graphs showing, by way of comparison tests, the behavior in a climate-controlled chamber (FIG. 8) and in the laboratory atmosphere (FIG. 9), respectively, of a raw film of Alq3 with a thickness of 100 nm deposited on silicon but not encapsulated, showing for each of these conditions the variation during the storage time of the intensity of photoluminescence (FL) of the film and the variation of the position of the peak at maximum intensity.
Figure 9:
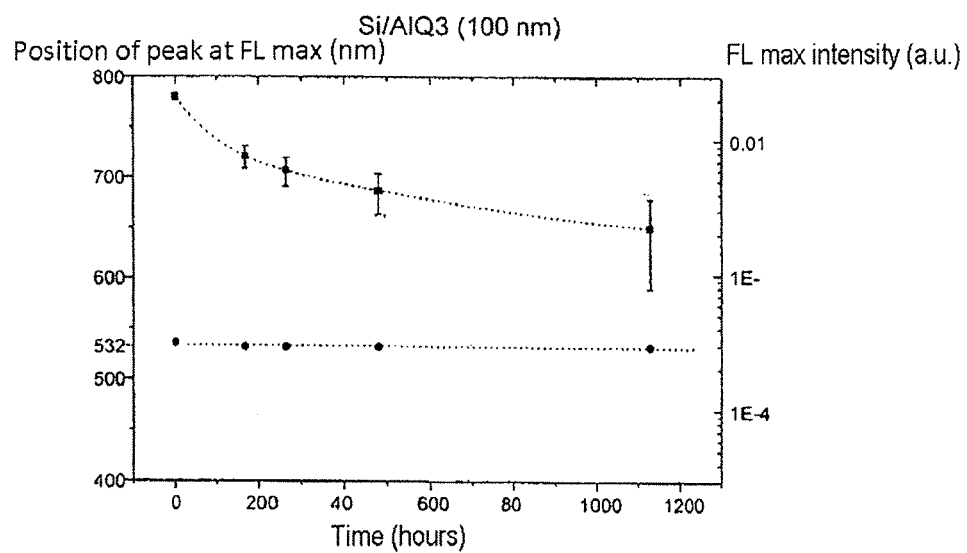

For comparison, a further test was conducted on the behavior of a raw film of Alq3 stored in a climate-controlled chamber at 65° C./85% RH (FIG. 8) and in the laboratory atmosphere (FIG. 9).

The whole set of results clearly shows that the film of $SiO_x$ provides considerable protection for the film of Alq3 in which the intensity of FL after about 850 hours of storage has lost only about 10% of its value in the case of encapsulation by 25 nm of $SiO_x$, and has lost only about 17% of its value after about 550 hours in the case of encapsulation by 10 nm of $SiO_x$.

On the other hand, the FL intensity of the non-encapsulated film stored at 65° C./85% RH (see FIG. 8) is divided by 300 after only 12 hours in the oven. This is clearly accompanied by crystallization of the organometallic layer, in which the position of the peak FL undergoes a blue shift to 496 nm after 12 hours of storage. As for the raw Alq3 film kept in the laboratory atmosphere (see FIG. 9), this shows a decrease in the FL intensity by a factor of about 10 after approximately 1200 hours of storage, but with no apparent crystallization.

Figure 10:
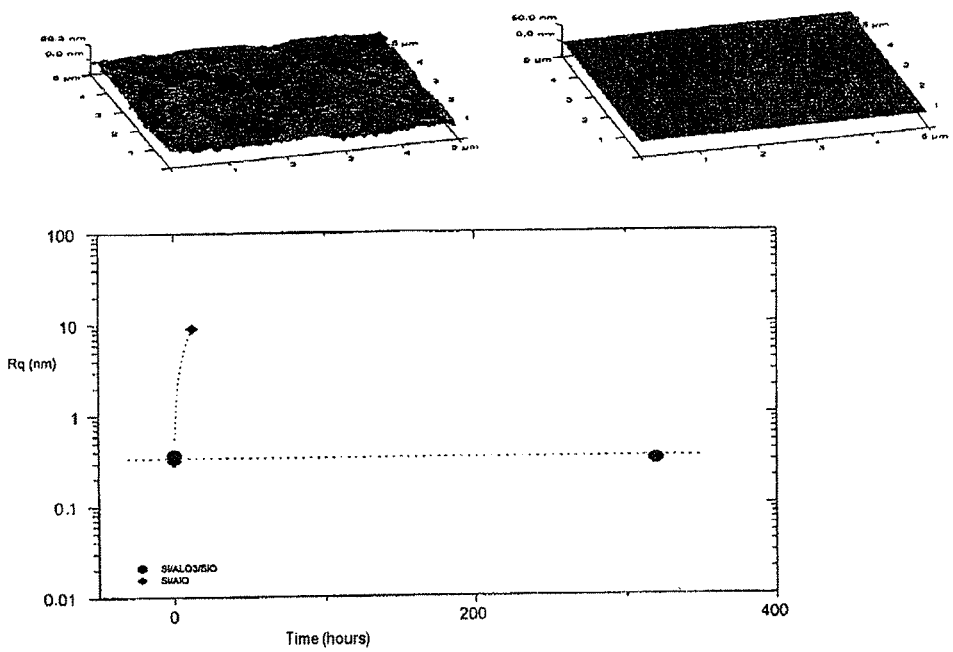
FIG. 10 is a graph to which are attached two photographs obtained by an atomic force microscope, illustrating the surface roughness Rq, after 12 hours of storage in a climate-controlled chamber, of a raw film of Alq3 with a thickness of 100 nm, deposited on silicon (the control test, corresponding to the upper left-hand photograph), and a layer of Alq3 encapsulated with a layer of SiO (the test of the invention, corresponding to the upper right-hand photograph)

FIG. 10 shows the surface (in atomic force microscope images) of a control film of raw Alq3 (with a thickness of 100 nm and stripped of the $SiO_x$ film) deposited on silicon after 12 hours of storage in a climate-controlled chamber (at 65° C. and 85% RH), together with the variation of the surface roughness (Rq) as a function of storage time, by comparison with the same film of Alq3 encapsulated according to the invention with a film of $SiO_x$. It was found that the roughness of the Alq3/$SiO_x$ film remained completely stable—at about 0.3 nm—after more than 350 hours in an oven (see the right-hand image above the graph), whereas the surface of the non-encapsulated Alq3 film showed a very high degree of roughness of about 10 nm after 12 hours of storage (left-hand image).

The present applicant has also made measurements of the density of defects in the $SiO_x$ layer as a function of the layers present under this layer of $SiO_x$, these measurements being shown in Table 1 below:

TABLE 1

| /cm² | SiOx | AlQ3/SiOx | SiOx/Al2O3 | AlQ3/SiOx/Al2O3 |
|---|---|---|---|---|
| on OLED | 300 | | 5 | 5 |
| on Si | | 60 | | 6 |

For the deposition on the OLED, the $SiO_x$ was deposited on a silver cathode (with a thickness of 15 nm).

Figure 11:
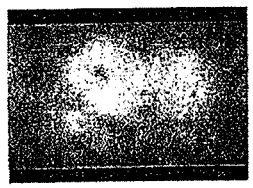
FIG. 11 is a photograph obtained by optical microscopy, showing the defects visible in the form of black spots on the surface of an OLED covered, by way of a control test, with an encapsulation layer of evaporated SiO, after more than 840 hours in the laboratory.
Figure 12:
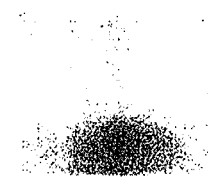
FIG. 12 is a photograph obtained by optical microscopy (negative image, showing far fewer defects, in the form of over-bright areas) of the surface of an Si/Alq3/SiO pre-encapsulation structure according to the invention after more than 536 hours in the laboratory.

The count was conducted by observation of the black spots on the OLED (see FIG. 11) and the over-bright zones clearly visible for the films deposited on Si (see FIG. 12). Each over-bright zone and each black spot was counted as a defect, on the assumption that there were no defects invisible to the optical microscope. FIG. 11 shows the surface of an OLED using an encapsulation layer of evaporated $SiO_x$ after more than 840 hours in the laboratory atmosphere (at 6 V, by optical microscopy at x 2.5, with a defect density of about 300/cm$^2$), and FIG. 12 shows the surface of an Si/Alq3/$SiO_x$ structure after more than 536 hours at 65° C. and 85% RH (by optical microscopy with a negative image for better observation, revealing few over-bright zones indicating defects, present at a density of about 60/cm$^2$).

Consequently, the defect density in $SiO_x$ appears to be much smaller when it is on Alq3 than when it is placed directly on the silver cathode of the OLED unit. The Alq3 compound therefore appears to be highly advantageous for the formation of a layer 11 with good buffer properties for the purpose of growing a barrier layer 12 of evaporated $SiO_x$ with fewer defects.

Figure 13:
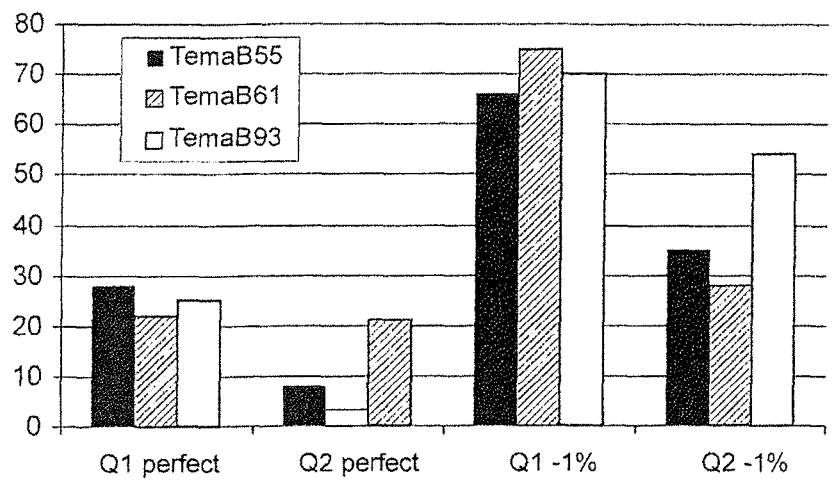
FIG. 13 is a bar chart showing the rate of perfect Q1, perfect Q2, Q1 at −1% and Q2 at −1%, after 200 hours of storage, for three devices, TemaB55, TemaB61 and TemaB93.
Figure 14:
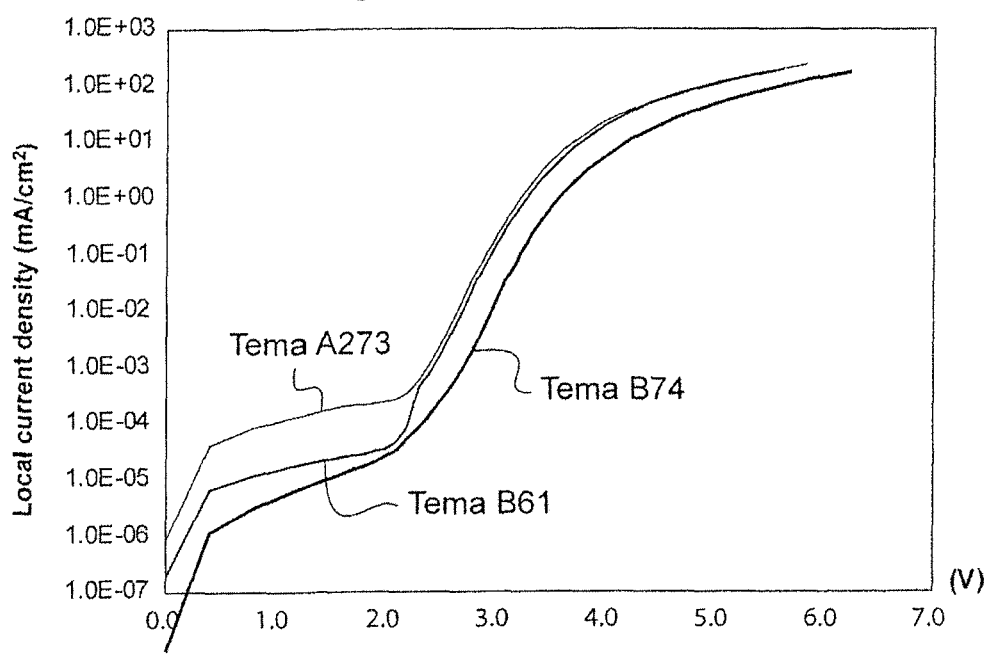
FIG. 14 is a graph with three IV curves (Q2, $t_0$), for the diodes TemaA273 (pre-encapsulated with Alq3/SiO according to the invention with $O_2$ plasma treatment and encapsulated with $Al_2O_3$), TemaB61 (control, with only SiO pre-encapsulation and $Al_2O_3$ encapsulation) and TemaB74 (pre-encapsulated with SiO and without encapsulation), showing by way of comparison the Q2 content of this diode according to the invention following exposure to ambient air and to plasma treatment.
Figure 15:
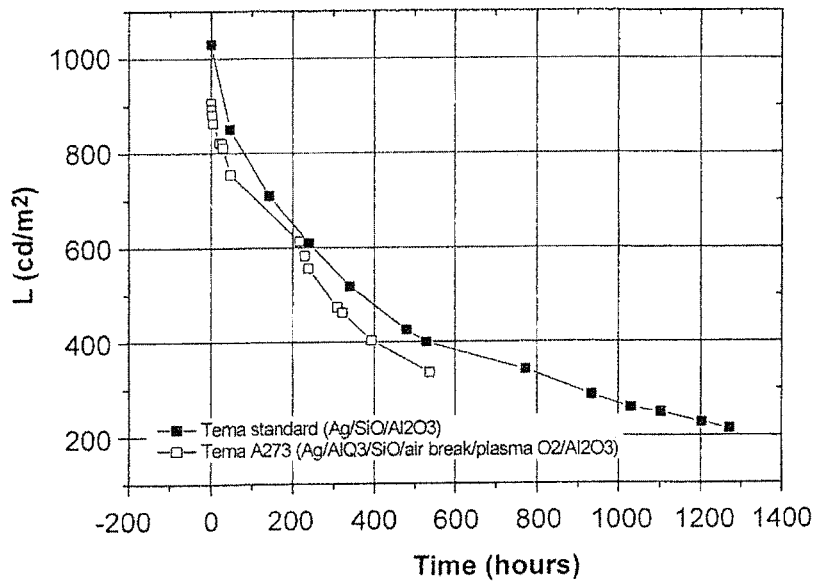
FIG. 15 is a graph illustrating the increased lifetime in terms of luminance L of Q2 diodes according to the invention (TemaA273), by comparison with the control diode TemaB61.

FIGS. 13 to 15 illustrate, notably, the possibility of carrying out plasma treatment (using an oxygen plasma, for example) on the surface of the pre-encapsulated OLED unit before its encapsulation. This treatment facilitates the subsequent deposition by ALD. This may be explained by the fact that this treatment makes it possible, notably, to functionalize the whole surface of the substrate 2 with —OH in order to grow an encapsulation layer 13 (typically made of $Al_2O_3$) thereon by means of ALD, but without degrading the characteristics of the device which are sensitive, notably, to an oxidizing atmosphere.

In fact, the present applicant has demonstrated that the use of the Alq3/$SiO_x$ pre-encapsulation does indeed enable such a surface treatment to be carried out by means of $O_2$ plasma before the deposition of the inorganic layer of $Al_2O_3$ encapsulation 13 deposited by ALD (see again FIG. 2, described below, for this plasma treatment P), because of the protection imparted by this pre-encapsulation with two layers 11 and 12 acting as a hard mask. It was even possible to carry out a direct transfer to the ambient air between the exit from the deposition enclosure and the plasma chamber located in the breathable atmosphere of the clean room, without degrading the tested OLED unit.

The graph of FIG. 13 illustrates the rate of perfect diodes and −1% diodes (that is to say, those in which the defective surface represents less than 1% of the total surface of the diode), for both Q1 and Q2, after 200 hours of storage for each of the TemaB55, TemaB61 and TemaB93 devices whose characteristics are shown in Table 2 below.

and 90%. In FIG. 13, the same rates are compared after 200 hours. There is a clearly visible improvement in the Q2 diodes when the plasma treatment is carried out on the $SiO_x$ before the deposition of $Al_2O_3$.

The three curves on the graph of FIG. 14 represent the IV characteristics of the diodes (Q2, $t_0$) TemaA273, TemaB61 and TemaB74, respectively, and these curves show that the characteristics of the diodes (Q2) that have undergone exposure to air followed by the plasma treatment (i.e. TemaA273) are not affected, by comparison with the reference TemaB61. Predictably the reference TemaB74 without $Al_2O_3$ encapsulation undergoes immediate oxidation of its fine cathode as soon as it emerges into the breathable atmosphere, which inevitably leads to a considerable shift toward high voltages at fixed current. As a general rule, since Q2 diodes are highly sensitive to the atmosphere, they are very rapidly degraded in devices of the TemaB74 type and cease to emit light at the usual operating voltages (V<5 volts) after a few days.

The lifetime of the TemaA273 according to the invention, when subjected to exposure to ambient air and to $O_2$ plasma, was evaluated, and was then compared to that of the standard TemaB61 device in order to verify that these successive treatments of exposure to air and to $O_2$ plasma did not affect the diode in any way. The result is shown in FIG. 15, in which the curves do indeed show that the lifetime (for Q2, at constant current and initial luminance of approximately 1000 cd/m$^2$) of the TemaA273 device is only slightly modified relative to that of this reference.

Figure 18:
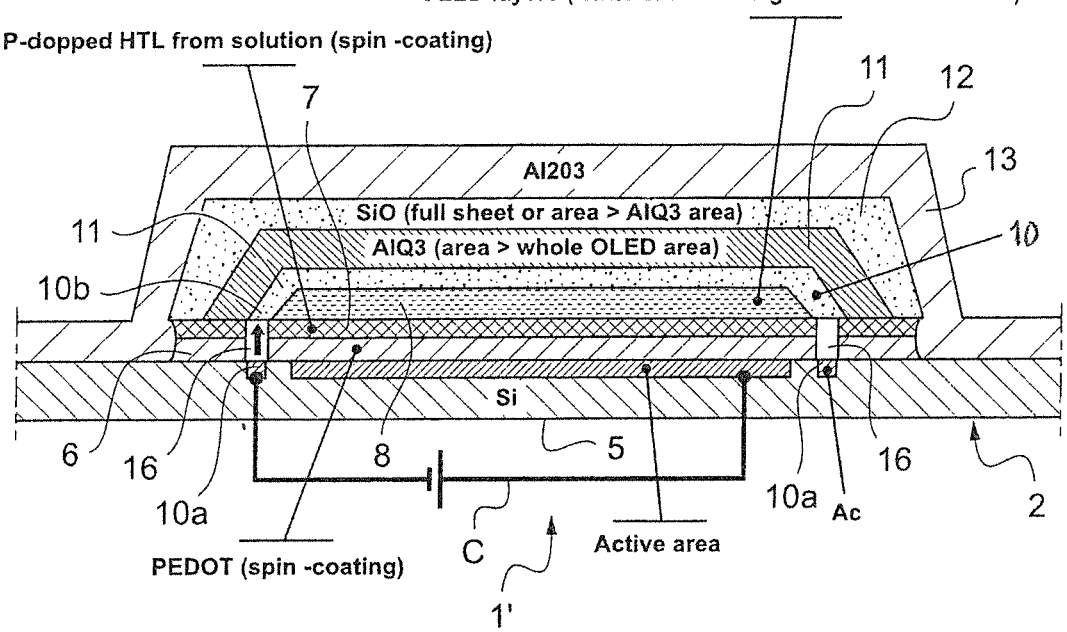
FIG. 18 is a schematic cross-sectional view of another device according to the invention corresponding to a variant of FIG. 4, showing an electrically conductive annular channel formed between the cathode and the cathode ring by deposition of metal atoms through the internal organic films deposited by a liquid route.

The device 1' in the variant of FIG. 18 is uniquely distinguished from that of FIG. 4 in that an annular channel 16 is formed through the inner organic films 6 and 7 deposited by a liquid route, to provide electrical conduction between the cathode 10 and the cathode ring 10a forming the track for electrical contact with the anode 5 (the electrical circuit C connecting the anode 5 to the cathode ring 10a is shown schematically in FIG. 18).

Figure 21:
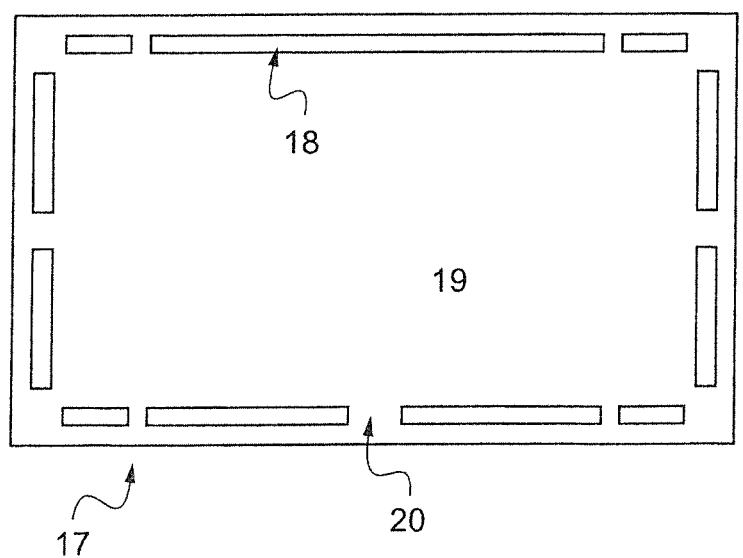
FIG. 21 is a schematic plan view of an example of a perforated mask which can be used to produce the electrically conductive channel of FIG. 18.
Figure 19A:
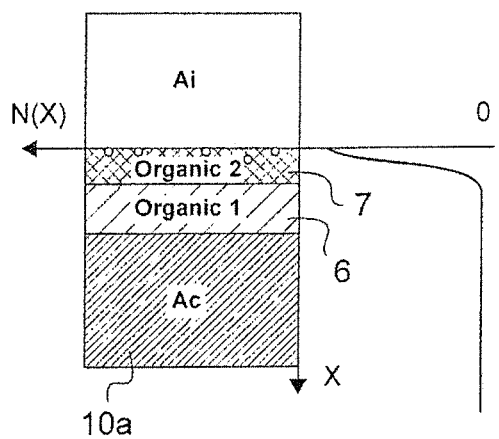
FIGS. 19A and 19B are partial schematic cross-sectional views illustrating the distributions of metal atoms obtained, respectively, with a method not according to the invention and with a method according to the invention, in order to produce the channel of FIG. 18 in a first exemplary embodiment of this variant, related, for each of these figures, to a curve showing the gradient of this distribution along the vertical direction x of the section plane.
Figure 19B:
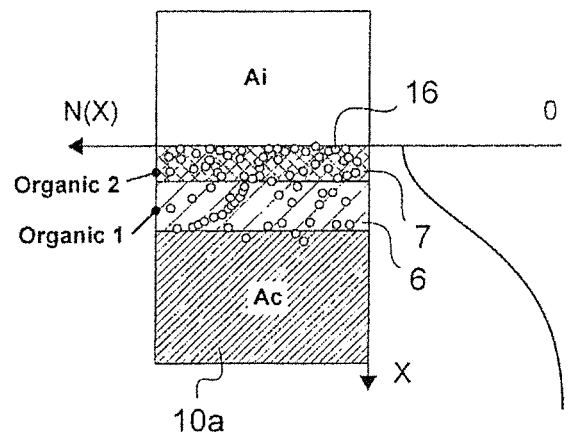
Figure 20A:
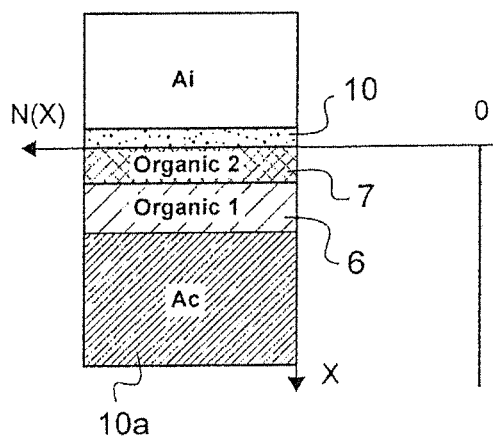
FIGS. 20A and 20B are views similar to those of FIGS. 19A and 19B, illustrating the schematic distributions obtained, respectively, with a method not according to the invention and with a method according to the invention, in order to produce the channel of FIG. 18 in a second exemplary embodiment of this variant, related, for each of these figures, to a curve showing the gradient of this distribution along the vertical direction x of the section plane.
Figure 20B:
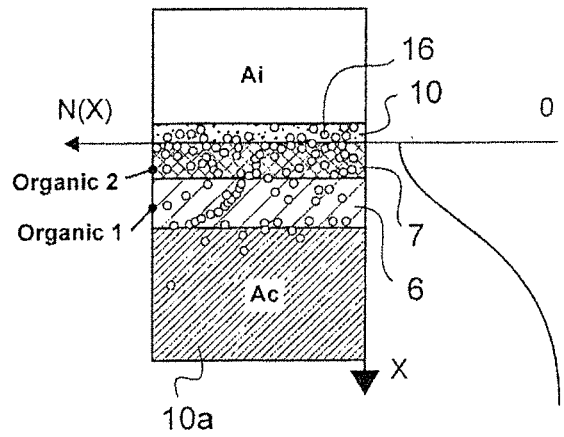

The channel 16 is formed, for example, from aluminum atoms deposited by a PVD method of local spraying through the films 6 and 7, by means of a perforated mask 17 (known as a "shadow mask") such as that shown schematically in FIG. 21, so that these atoms pass through these films 6 and 7, resulting in a sufficiently dense distribution in contact with the inner peripheral edge 10b of the cathode 10 placed on top of the films 6, 7, 8 and with the cathode ring 10a. This distribution according to the invention is illustrated in FIGS. 19B and 20B described below.

It can be seen in the example of FIG. 21 that this mask 17 generates open zones 18 formed by a discontinuous peripheral line, and closed zones 19 and 20 comprising an interstice

| Tema name: | Cathode | Buffer layer (thickness) | Barrier layer (thickness) | Period in air before ALD | O2 plasma (power, time) | Al2O3 (thickness) |
|---|---|---|---|---|---|---|
| B74 | Ag (15 nm) | | SiO (25 nm) | | | |
| B55 | Ag (15 nm) | AlQ3 (100 nm) | SiO (25 nm) | | | 25 nm |
| B61 (ref) | Ag (15 nm) | | SiO (25 nm) | | | 25 nm |
| B93 | Ag (15 nm) | AlQ3 (100 nm) | SiO (25 nm) | | 160 W, 180 s (cleaning) | 25 nm |
| A273 | Ag (15 nm) | AlQ3 (100 nm) | SiO (25 nm) | 5 mins | 90 W, 50 s (RIE) | 25 nm |

It is important to note here that the $O_2$ plasma treatment carried out on the SiO level of the OLED does not give rise to black spots in the initial state. On the contrary, at $t_0$, the rates of perfect Q2 (cut diodes) for TemaB55, TemaB61 and TemaB93 are, respectively, 98%, 68% and 90%. For the rates of Q1 (flat diodes), these values are, respectively, 92%, 62%

20 which is provided between two adjacent open zones 18 and which allows the passage of the electrical line for contact with the anode 5.

Thus the channel 16 is produced in the form of an electrically conductive annular film which, because of this spraying method, penetrates the films 6 and 7 deposited by a liquid route which are relatively soft, until it reaches the cathode ring 10a. The condensation of the aluminum atoms with substantial energy in spraying allows them to penetrate or "pierce" the underlying films 6 and 7. A distribution of these metal atoms is then created in these films 6 and 7, providing a percolation pathway for the electrons and therefore an improved electrical contact for the diode.

FIG. 19B illustrates a first exemplary embodiment of this conductive channel 16, in which the spraying is carried out directly on the stack of the two films 6 and 7 deposited by a liquid route (that is to say, before the subsequent deposition of the cathode 10). It can be seen that the dense and relatively homogeneous distribution N(x) of the aluminum atoms that have penetrated the underlying films 6 and 7 enables this channel 16 to be created, by contrast with FIG. 19A in which the deposition of aluminum by thermal evaporation is not capable of providing this distribution penetrating into the films 6 and 7.

FIG. 20B illustrates a second exemplary embodiment of the conductive channel 16, in which the spraying is carried out directly on the cathode 10 when the latter has been deposited on the stack of films 6, 7, 8, the cathode being chosen to be relatively fine (having a thickness of less than 20 nm and being made of silver, for example). It can be seen that the dense and relatively homogeneous distribution N(x) of the aluminum atoms that have penetrated the underlying films 6 and 7 deposited by a liquid route enables this channel 16 to be created, by contrast with FIG. 20A in which the deposition of aluminum by thermal evaporation is not capable of providing this distribution penetrating into these films 6 and 7.

The invention claimed is:

1. An organic optoelectronic device comprising:
    a substrate,
    at least one electroluminescent unit deposited on said substrate and incorporating an internal electrode adjacent to said substrate, an external electrode which is transparent or semi-transparent to the light emitted by said at least one electroluminescent unit and which defines an active light emission zone, and a stack of organic films between said internal electrode and said external electrode, said stack comprising innermost said organic films, and
    a thin-layer encapsulation structure which comprises at least one inorganic layer which is placed on top of said at least one electroluminescent unit and encases it laterally,
    said organic optoeletronic device further comprising a pre-encapsulation structure which is located between said external electrode and said thin-layer encapsulation structure and which comprises a buffer layer covering said external electrode and based on at least one heterocyclic organometallic complex with a glass transition temperature above 80° C., and a barrier layer covering said buffer layer and based on a silicon oxide with the formula $SiO_x$, where x is a real number such that $0<x<2$,
    wherein said at least one electroluminescent unit is of the hybrid type, at least one of said innermost organic films forming at least an electron transport film (ETL), a hole injection film (HIL) or a hole transport film (HTL) and being deposited by a liquid route over all said substrate and then structured by dry etching to obtain said at least one of said innermost organic films which is structured and terminates laterally substantially at right angles to a peripheral edge of said barrier layer,
    wherein the device comprises electrically conductive connecting means which directly link an inner peripheral edge of said external electrode surmounting said substrate to an electrical contact in a shape of a ring provided in said substrate, and which form an annular metallic channel in the form of a distribution of metal atoms spread through said at least one of said innermost organic films as far as said electrical contact.

2. The device as claimed in claim 1, wherein said pre-encapsulation structure forms a hard mask adapted to resist said dry etching, which is carried out by means of an oxygen plasma or by reactive ion etching.

3. The device as claimed in claim 1, wherein said distribution of metal atoms are additionally spread through said external electrode has a thickness of less than 20 nm.

4. The device as claimed in claim 1, wherein said at least one heterocyclic organometallic complex of said buffer layer is a quinoline or benzoquinoline derivative and has a glass transition temperature above 80° C.

5. The device as claimed in claim 4, wherein said at least one heterocyclic organometallic complex is tris(8-hydroxyquinolinato)aluminum (III) (Alq3).

6. The device as claimed claim 1, wherein said silicon oxide with the formula $SiO_x$ of said barrier layer is such that x is substantially equal to 1, and in that said barrier layer is deposited by non-reactive thermal evaporation.

7. The device as claimed in claim 1, wherein said buffer layer has a surface area at least equal to that of said external electrode which is formed from a silver cathode, and in that said barrier layer has a surface area at least equal to that of said buffer layer.

8. The device as claimed in claim 7, wherein said barrier layer extends laterally around and beyond said buffer layer which extends laterally around and beyond said external electrode, both of said buffer layer and said barrier layers extending continuously from said at least one of said innermost organic films.

9. The device as claimed in claim 1, wherein said thin-layer encapsulation structure comprises an inner said inorganic layer which is deposited on said barrier layer by atomic layer deposition (ALD) or by plasma-assisted chemical vapor phase deposition (PECVD), which is based on at least one inorganic compound chosen from the group formed by compounds with the formulae $Al_xO_y$, $SiO_x$, $Si_xN_y$, $SiO_xN_y$, ZnSe, $Sb_2O_3$ and transparent conductive oxides (TCOs) optionally combined with a metal, and based on $Al_2O_3$ deposited by ALD, said inner inorganic layer extending from said substrate and laterally coating said barrier layer and a plurality of said organic films of said stack of organic films.

10. The device as claimed in claim 9, wherein said thin-layer encapsulation structure further comprises:
    at least one etched photosensitive polymer layer which is based on a positive photolithographic resin and which covers said inner inorganic layer in a laterally encasing manner by extending from said substrate, and
    an outer said inorganic layer which is external relative to said inner organic layer, is based on the same compound as said inner inorganic layer, and which covers said at least one etched photosensitive polymer layer in a laterally encasing manner, so as to form a plurality of surfaces, parallel to each other and substantially perpendicular to the plane of said substrate, which surfaces form a same number of obstacles to a lateral penetration of water vapor toward said active light emission zone of the device.

* * * * *